(12) United States Patent
Cheng et al.

(10) Patent No.: US 11,051,109 B2
(45) Date of Patent: Jun. 29, 2021

(54) DUAL BACK-PLATE AND DIAPHRAGM MICROPHONE

(71) Applicant: Taiwan Semiconductor Manufacturing Co., Ltd., Hsin-Chu (TW)

(72) Inventors: Chun-Wen Cheng, Zhubei (TW); Chia-Hua Chu, Zhubei (TW); Wen-Tuan Lo, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/506,037

(22) Filed: Jul. 9, 2019

(65) Prior Publication Data

US 2020/0107130 A1 Apr. 2, 2020

Related U.S. Application Data

(60) Provisional application No. 62/737,245, filed on Sep. 27, 2018.

(51) Int. Cl.
*H04R 7/10* (2006.01)
*B81B 3/00* (2006.01)
(Continued)

(52) U.S. Cl.
CPC ............. *H04R 7/10* (2013.01); *B81B 3/0005* (2013.01); *B81B 3/0021* (2013.01); *B81C 1/00182* (2013.01); *B81C 1/00968* (2013.01); *H04R 7/16* (2013.01); *H04R 19/04* (2013.01); *H04R 31/003* (2013.01); *B81B 2201/0257* (2013.01);
(Continued)

(58) Field of Classification Search
CPC . H04R 7/10; H04R 7/16; H04R 19/00; H04R 19/005; B81B 3/005; B81B 3/0021; B81B 3/00182; B81C 2201/112; B81C 2201/0133
See application file for complete search history.

(56) References Cited

U.S. PATENT DOCUMENTS 9,630,837 B1 * 4/2017 Chu ..................... B81B 3/0021
2008/0192962 A1 8/2008 Halteren
(Continued)

FOREIGN PATENT DOCUMENTS

| CN | 104853299 A | 8/2015 |
| CN | 105451145 A | 3/2016 |
| JP | 2010114878 A | 5/2010 |

*Primary Examiner* — Sunita Joshi
(74) *Attorney, Agent, or Firm* — Eschweiler & Potashnik, LLC

(57) ABSTRACT

A MEMS microphone includes a substrate having an opening, a first diaphragm, a first backplate, a second diaphragm, and a second backplate. The first diaphragm faces the opening in the substrate. The first backplate includes multiple accommodating-openings and it is spaced apart from the first diaphragm. The second diaphragm joints the first diaphragm together at multiple locations by pillars passing through the accommodating-openings in the first backplate. The first backplate is located between the first diaphragm and the second diaphragm. The second backplate includes at least one vent hole and it is spaced apart from the second diaphragm. The second diaphragm is located between the first backplate and the second backplate.

20 Claims, 14 Drawing Sheets

(51) Int. Cl.
  *B81C 1/00* (2006.01)
  *H04R 7/16* (2006.01)
  *H04R 19/04* (2006.01)
  *H04R 31/00* (2006.01)

(52) U.S. Cl.
  CPC ............ *B81B 2203/0127* (2013.01); *B81C 2201/0133* (2013.01); *B81C 2201/112* (2013.01); *H04R 2201/003* (2013.01)

(56) References Cited

U.S. PATENT DOCUMENTS

| | | |
|---|---|---|
| 2009/0074222 A1 | 3/2009 | Song |
| 2012/0091546 A1* | 4/2012 | Langereis ............ H04R 31/006 257/416 |
| 2012/0234093 A1 | 9/2012 | Black et al. |
| 2015/0001647 A1* | 1/2015 | Dehe .................... B81B 3/0021 257/416 |
| 2015/0146906 A1 | 5/2015 | Je et al. |
| 2015/0189444 A1* | 7/2015 | Pan ........................ H04R 19/04 381/173 |
| 2017/0230757 A1 | 8/2017 | Kuntzman et al. |
| 2017/0269120 A1 | 9/2017 | Yang et al. |
| 2018/0086624 A1* | 3/2018 | Cheng ..................... B81B 3/007 |
| 2020/0204925 A1 | 6/2020 | Zou et al. |

* cited by examiner

Venting Hole
55

Air Blow

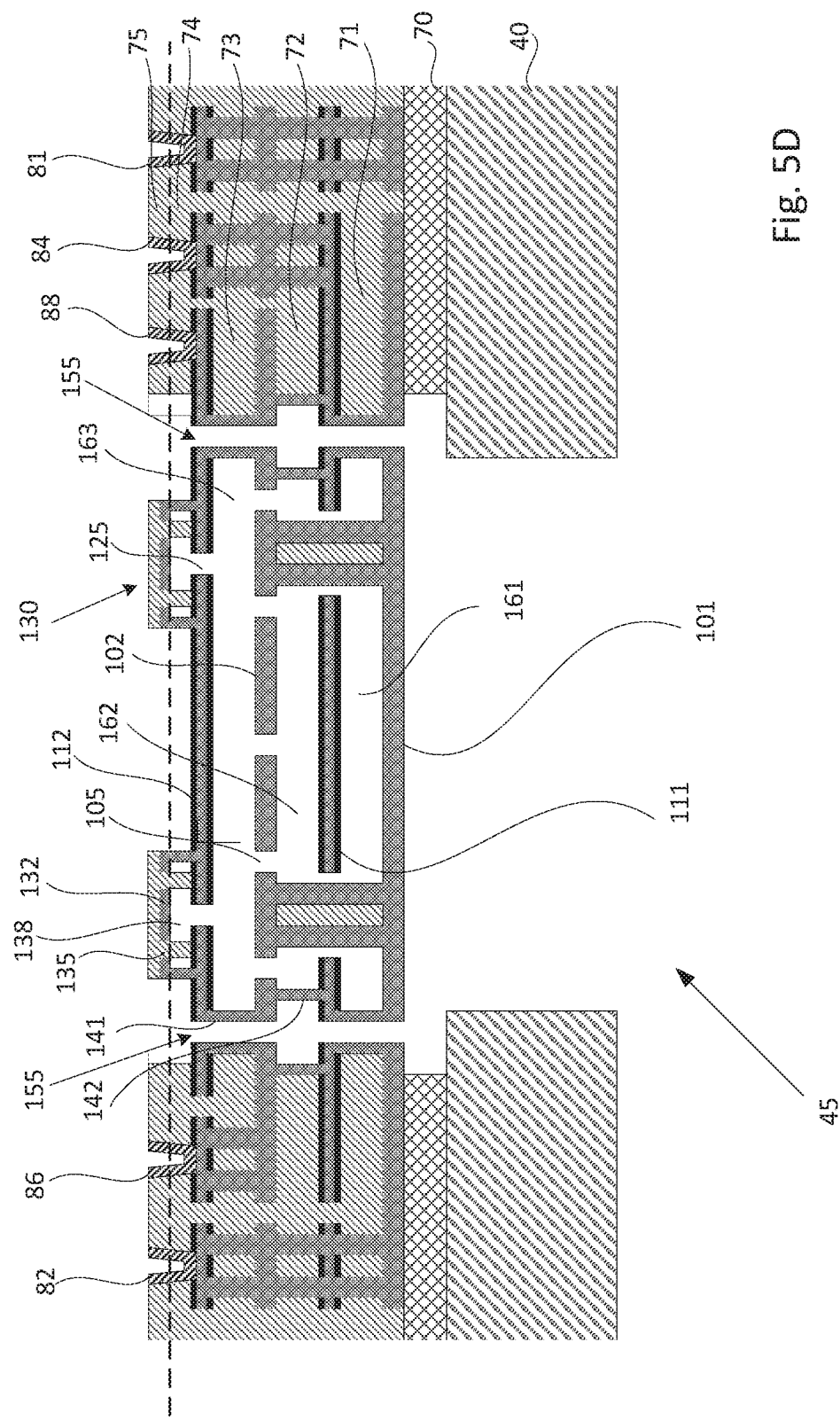

DUAL BACK-PLATE AND DIAPHRAGM MICROPHONE

REFERENCE TO RELATED APPLICATION

This application claims the benefit of U.S. Provisional Application No. 62/737,245, filed on Sep. 27, 2018, the contents of which are hereby incorporated by reference in their entirety.

BACKGROUND

A MEMS microphone generally includes a conductive diaphragm and a conductive backplate that is spaced apart from the conductive diaphragm. When the conductive diaphragm is deformed by energy of sound waves, a change of the capacitance between the conductive diaphragm and the conductive backplate can be detected. With the MEMS microphone, sound waves can be converted to electrical signals by sensing this capacitance change.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5D are cross-section views of device structures for showing one method of manufacturing a MEMS microphone in accordance with some embodiments.

DETAILED DESCRIPTION

Figure 1A:
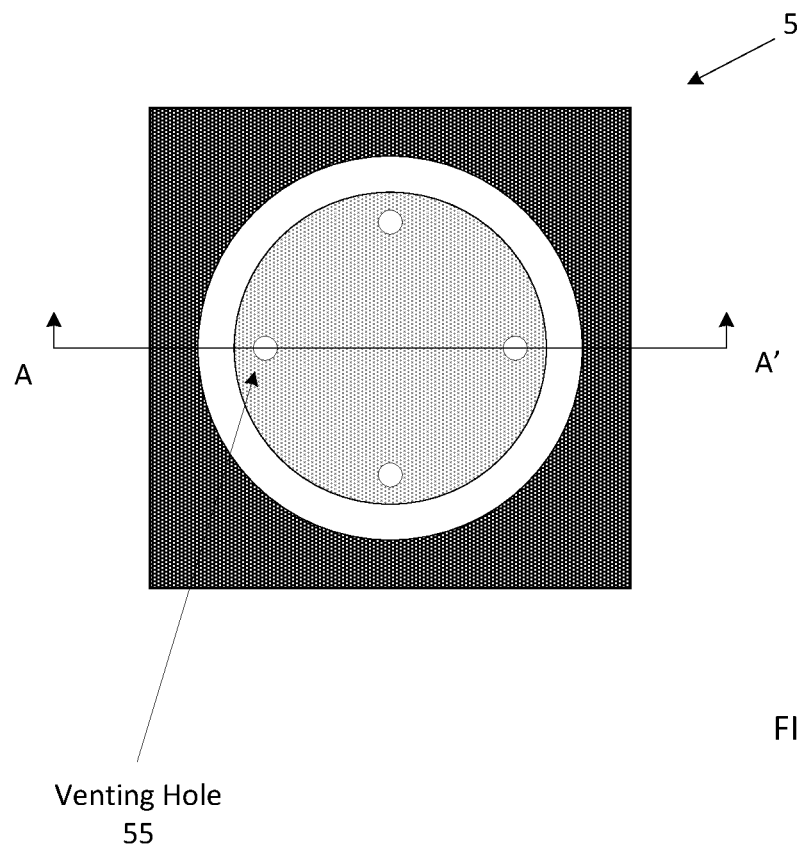
FIG. 1A is a top view of a diaphragm in a MEMS microphone.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
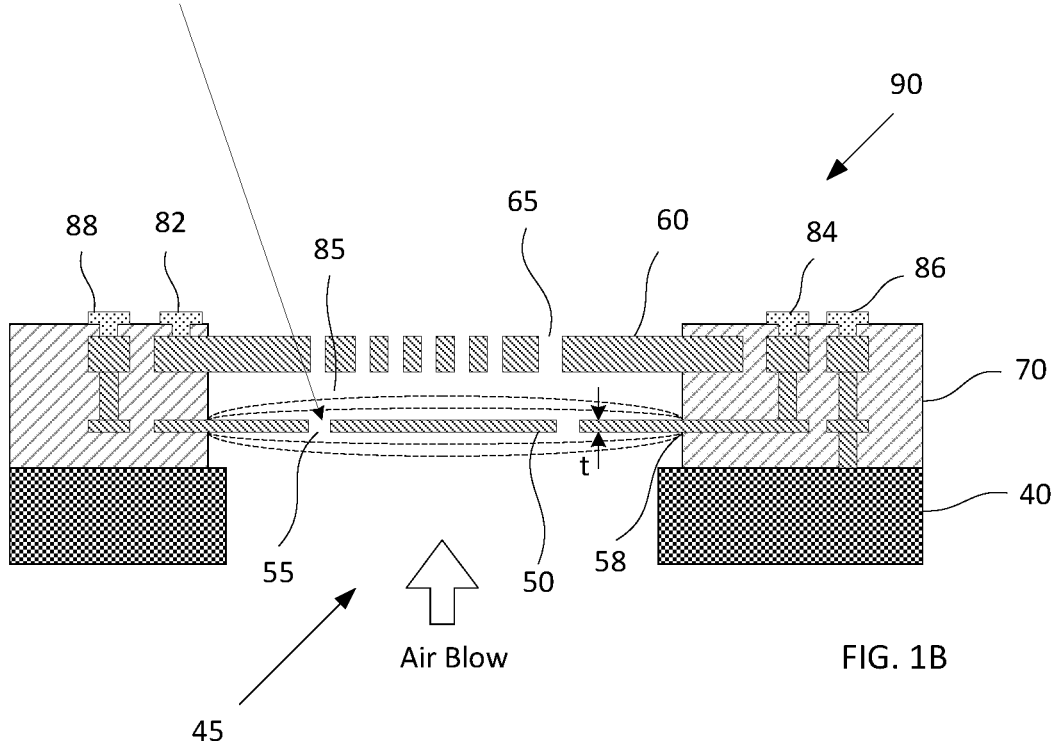
FIG. 1B is a cross-section view showing a MEMS microphone that is fabricated on a substrate.

Many micro-electromechanical system (MEMS) devices can be manufactured using semiconductor device fabrication methods. Examples of these MEMS devices include MEMS microphones, such as, a MEMS microphone 90 as illustrated in FIGS. 1A-1B. FIG. 1B is a cross-section view showing a MEMS microphone 90 that is fabricated on a substrate 40. The MEMS microphone 90 includes a backplate 60 and a diaphragm 50 spaced apart from the backplate 60. Both the backplate 60 and the diaphragm 50 can be electrically conductive, which form a capacitive element. An electrical contact 82 electrically connected to the backplate 60 forms a first terminal for the capacitive element, and an electrical contact 84 electrically connected to the diaphragm 50 forms a second terminal for the capacitive element.

FIG. 1A is a top view of the diaphragm 50 of the MEMS microphone 90 in FIG. 1B. The cross section A-A' of the diaphragm 50 is illustrated in FIG. 1B. The diaphragm 50 includes multiple venting holes 55 distributed on the diaphragm 50 (e.g., venting holes as shown or more). The diaphragm 50 also includes one or more anchor areas 58 located near a boundary of the diaphragm 50. The anchor areas 58 allow the boundary of the diaphragm 50 to be fixed relative to the backplate 60 and allow gaps between the diaphragm and the backplate to be changed at the center of the diaphragm 50 and at other locations on the diaphragm at some distance away from the anchor areas 58. The diaphragm 50 is deformable by energy of sound waves to make the diaphragm 50 bend towards or away from the backplate 60, as the sound waves exert pressures on the diaphragm 50 through an opening 45 in the substrate 40. The backplate 60 has multiple open areas 65. There is an air volume space 85 between the diaphragm 50 and the backplate 60. Air can get out of or get into the air volume space 85 through the air passages formed by the open areas 65 on the backplate 60 and/or by the venting holes 55 on the diaphragm 50, as the diaphragm 50 bends towards or away from the backplate 60.

The bending movement of the diaphragm 50 relative to the backplate 60 caused by the sound waves changes the capacitance of the capacitive element between the diaphragm 50 and the backplate 60. Such change of the capacitance can be measured with the electrical contact 82 and the electrical contact 84. For the same amount of air pressure exerted on the diaphragm 50 by the sound waves, if the rigidity of the diaphragm 50 decreases, the amount of the bend of the diaphragm 50 caused by the sound waves increases and the induced change of the capacitance increases as well. That is, decreasing the rigidity of the diaphragm 50 improves the sensitivity of the MEMS microphone 90. The rigidity of the diaphragm 50 can be decreased by selecting the material for making the diaphragm or by decreasing the thickness ("t" as shown in FIG. 1B) of the diaphragm.

The diaphragm 50 in the MEMS microphone 90 generally has to withstand an air blow test. For example, when the air pressure exerted on the diaphragm 50 by the air blow test is at about 0.2 MPa, the chance of getting the diaphragm 50 broken should be statistically negligible under accepted statistical standard. While increasing the rigidity of the diaphragm 50 can decrease the chance of breaking the diaphragm 50, such increasing of the rigidity also lowers the sensitivity of the MEMS microphone 90. In an alternative method, increasing the size of the venting holes 55 and/or increasing the total number of the venting holes 55 to increase overall open ratio can also decrease the chance of breaking the diaphragm 50. But such measure of increasing open ratio also lowers the sensitivity of the MEMS microphone 90, because such measure also lowers the sensing area. Furthermore, increasing open ratio may also increase the low corner frequency of the MEMS microphone 90, making it less sensitive to low frequency sound waves. It is desirable to improve diaphragm's chance to survive air blow tests without losing the sensitivity of the MEMS microphone.

Additionally, when particles and/or vapor get into the air volume space 85 between the diaphragm 50 and the backplate 60, the physical movement of the diaphragm 50 relative to the backplate 60 can be hindered because of stiction effects, which causes sensitivity degradation of the MEMS microphone. The stiction effects may also make the MEMS microphone appear to have unstable and/or inconsistent sensitivity. While methods of using dimple structure and surface treatment on the diaphragm 50 and/or the backplate 60 can be used for reducing the influence of the stiction effects, these methods may still be not effective. More techniques may be needed for reducing the influence of the stiction effects on the performance of the MEMS microphone.

Figure 2:
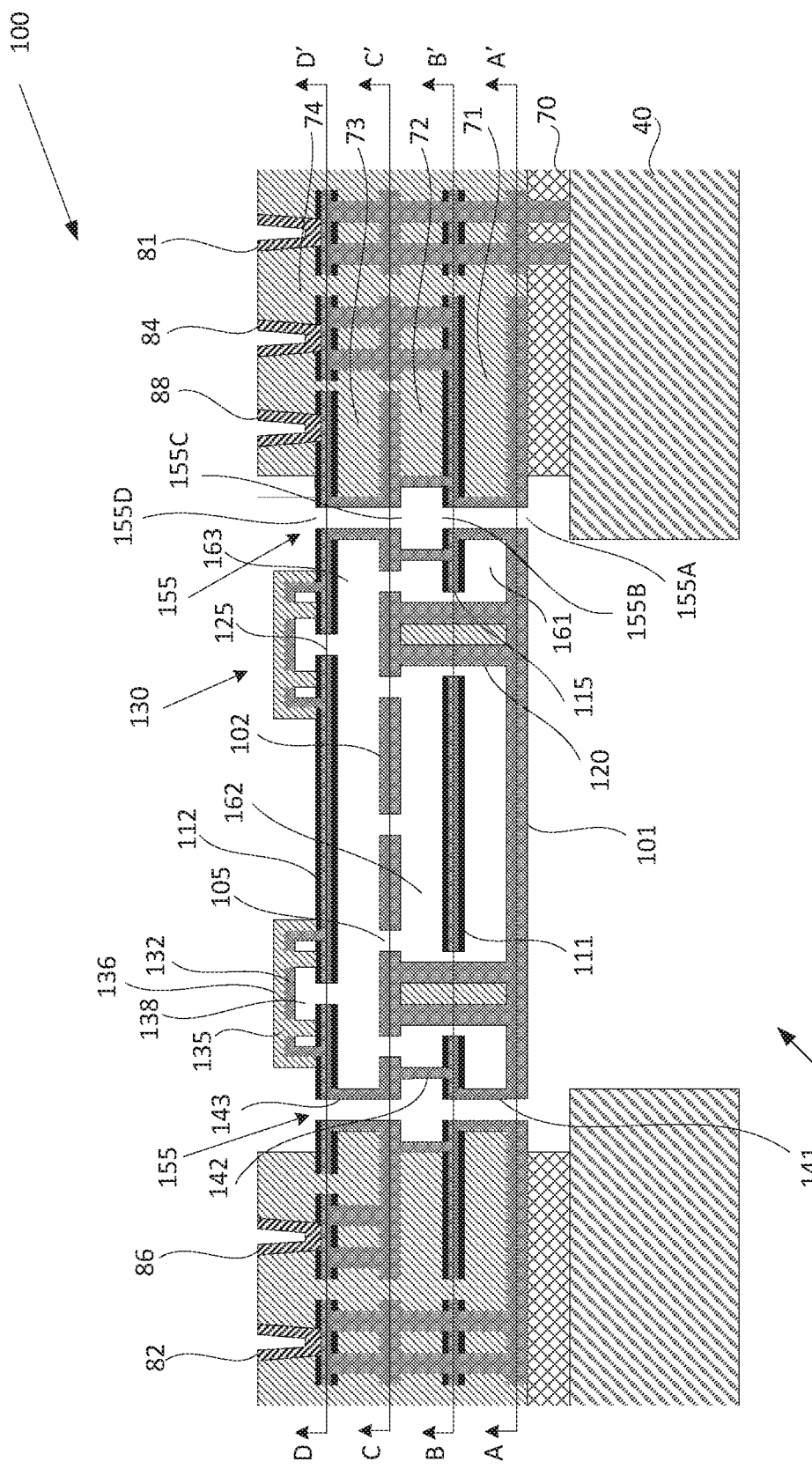
FIG. 2 is a cross-section view of a MEMS microphone having dual diaphragms in accordance with some embodiments.

FIG. 2 is a cross-sectional view of a MEMS microphone having dual diaphragms in accordance with some embodiments. In FIG. 2, a MEMS microphone 100 includes a substrate 40, a first diaphragm 101, a second diaphragm 102, a first backplate 111, and a second backplate 112. In some embodiments, the first diaphragm 101 and the first backplate 111 are both conductive and form two conductive terminals of a first capacitive element; the second diaphragm 102 and the second backplate 112 are both conductive and form two conductive terminals of a second capacitive element.

Figure 3A:
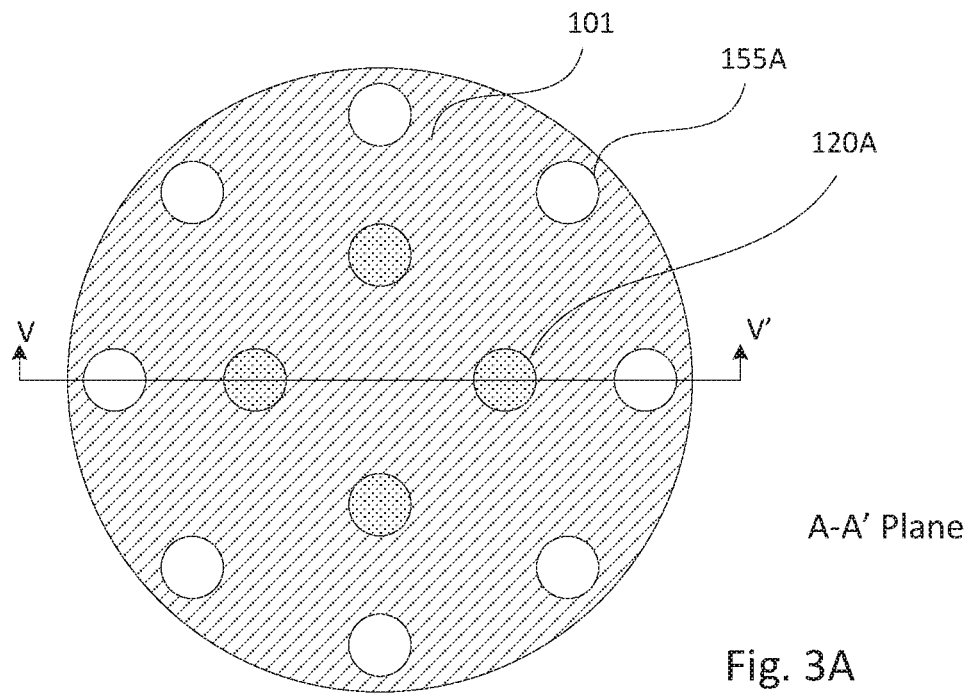
FIG. 3A is a schematic of the first diaphragm as viewed in a plane in accordance with some embodiments.
Figure 3B:
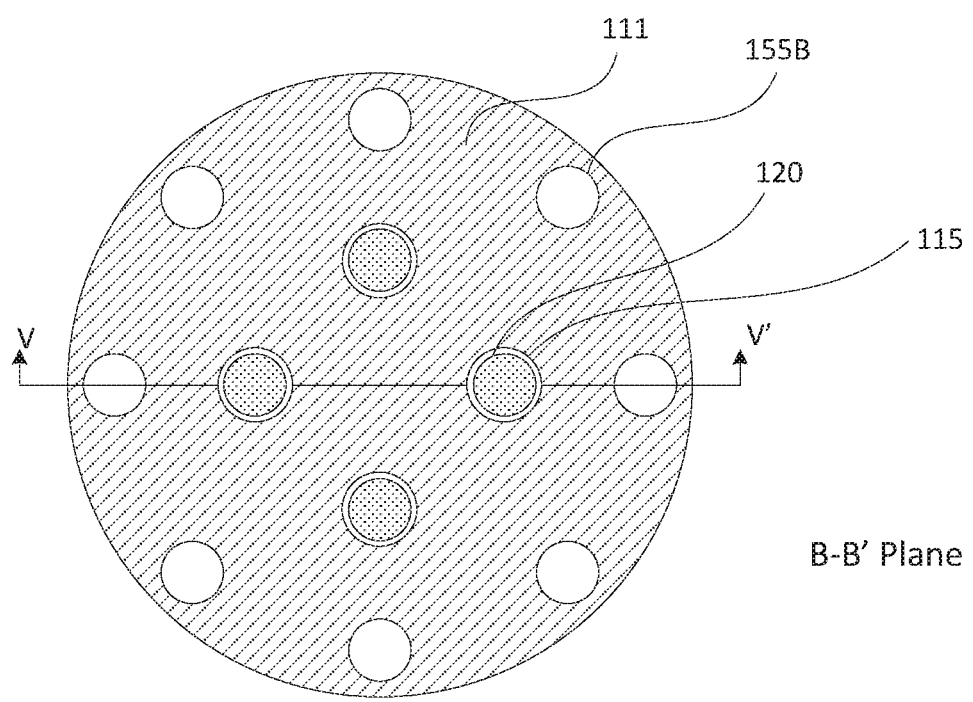
FIG. 3B is a schematic of the first backplate as viewed in a plane in accordance with some embodiments.
Figure 3C:
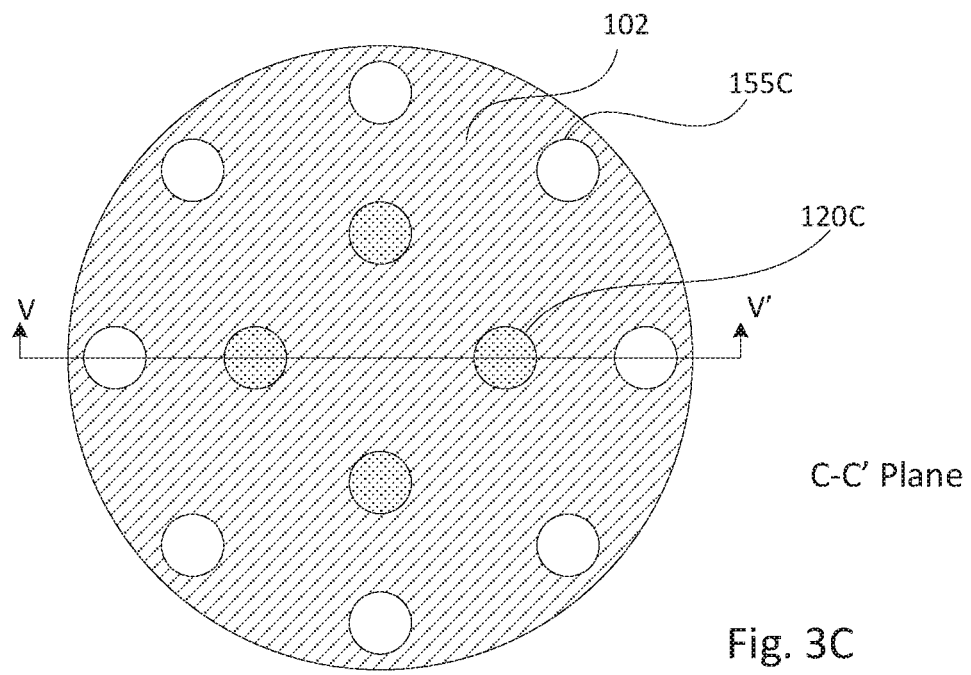
FIG. 3C is a schematic of the second diaphragm as viewed in a plane in accordance with some embodiments.
Figure 3D:
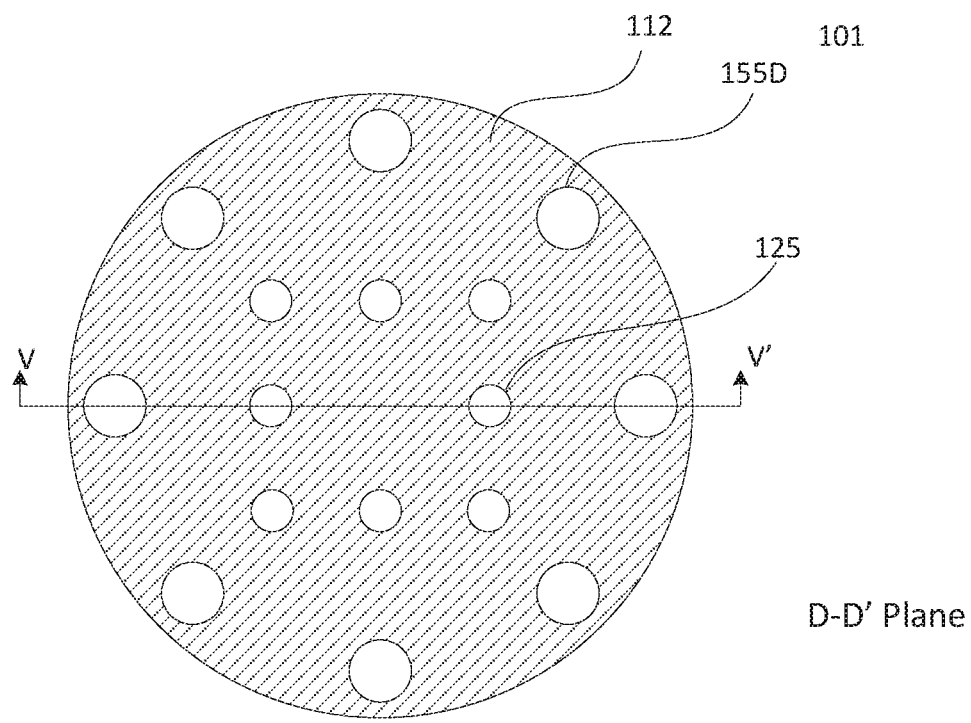
FIG. 3D is a schematic of the second backplate as viewed in a plane in accordance with some embodiments.

FIG. 3A is a schematic of the first diaphragm 101 as viewed in A-A' plane in accordance with some embodiments. FIG. 3B is a schematic of the first backplate 111 as viewed in B-B' plane in accordance with some embodiments. FIG. 3C is a schematic of the second diaphragm 102 as viewed in C-C' plane in accordance with some embodiments. FIG. 3D is a schematic of the second backplate 112 as viewed in D-D' plane in accordance with some embodiments. The cross-sections of the first diaphragm 101, first backplate 111, the second diaphragm 102, and the second backplate 112, in the V-V' plane, are illustrated in FIG. 2. The cross-sections of the substrate 40 and other layers of materials are also illustrated in FIG. 2.

As shown in FIG. 2, the substrate 40 includes an opening 45. In some embodiments, the substrate 40 can be a monocrystalline silicon substrate or a semiconductor-on-insulator (SOI) substrate (e.g., silicon on insulator substrate). For example, the substrate 40 can be silicon, glass, silicon dioxide, aluminum oxide, or a combination thereof. In some embodiments, CMOS circuit can be fabricated on a silicon substrate.

The first diaphragm 101 faces the opening 45 of the substrate 40. In some embodiments, a layer of base oxide 70 is formed between the substrate 40 and the conducting layer for the first diaphragm 101. The first diaphragm 101, spaced apart from the first backplate 111, is jointed with the first backplate 111 by a first seal structure 141 at a first boundary enclosing a first empty space 161 between the first diaphragm 101 and the first backplate 111. The first backplate 111 has multiple accommodating-openings 115 to allow pillars 120 to pass through. The second diaphragm 102 joints the first diaphragm together at multiple locations by pillars 120 through the accommodating-openings 115 in the first backplate 111. The first backplate 111 is located between the first diaphragm 101 and the second diaphragm 102. It will be appreciated that "empty space" as used herein, does not necessary mean the space is devoid of all atoms, but rather suggests that the space corresponds to vacuum, a fluid, or a gas (e.g., air or nitrogen).

The second diaphragm 102 is jointed with the first backplate 111 by a second seal structure 142 at a second boundary enclosing a second empty space 162 between the second diaphragm 102 and the first backplate 111. The second diaphragm 102, located between the first backplate 111 and the second backplate 112, is jointed with the second backplate 112 by a third seal structure 143 at a third boundary enclosing a third empty space 163 between the second diaphragm 102 and the second backplate 112. The second diaphragm 102 has multiple openings 105 that form air connections between the second empty space 162 and the third empty space 163.

In the embodiments as shown in FIG. 2, there are multiple chambers 130 located at one side of the second backplate 112. In some embodiments, the second backplate 112 has a vent hole 125 that forms an air connection between the third empty space 163 with an inner space 138 in one of the multiple chambers 130. In some embodiments, the second backplate can have more than one vent hole 125 that forms an air connection between the third empty space 163 with the inner space 138. The chamber 130 includes a side wall 132 spaced apart from the second backplate 112. The side wall 132 has two sealable openings 135, and each of the two sealable openings 135 is laterally shifted from the vent hole 125. In some embodiments, the side wall 132 can include only one sealable opening, which is laterally shifted from the vent hole 125. In some embodiments, the side wall 132 can include more than two sealable openings each laterally shifted from the vent hole 125. The sealable openings 135 as shown in FIG. 2 can be sealed with a hermetic sealing-layer 136 deposited on the side wall 132. Depending upon the sealing process used in the fabrication, the hermetic sealing-layer 136 for sealing the sealable opening 135 can be a metal layer or an oxide layer.

When each of the sealable opening 135 in the side wall 132 is sealed with the hermetic sealing-layer 136, a hermetically sealed empty space can be formed with the combination of the inner space 138 of each chamber 130 and the other three empty spaces (e.g., the first empty space 161, the second empty space 162, the third empty space 163). This hermetically sealed empty space is hermetically sealed by the combination of the hermetic sealing-layer 136, the first seal structure 141, the second seal structure 142, and the third seal structure 143. In some embodiments, the combined empty space formed with the combination of the inner space 138 of each chamber 130 and the other three empty spaces (e.g., the first empty space 161, the second empty space 162, the third empty space 163) can be first brought into equilibrium with a predetermined air pressure in a vacuum space; then, each of the sealable openings 135 in the side wall 132 is sealed with the hermetic sealing-layer 136 while some vacuum (e.g., with a pressure ranging from $10^{-9}$ to $10^{-3}$ torr) is maintained at the environment. After each of the sealable openings 135 is sealed in the vacuum maintained, each of the first empty space 161, the second empty space 162, and the third empty space 163 becomes vacuum space with its pressure lower than a predetermined value. In some embodiments, the residual pressure of this vacuum space can be in the range from $10^{-9}$ to $10^{-3}$ torr. After the hermetic sealing of the sealable openings 135, no particles and vapor can get into the sealed empty space; consequently, and the influence of the stiction effects on the performance of the MEMS microphone 100 is reduced.

In FIG. 2, the first diaphragm 101 and the second diaphragm 102 are both deformable when sound waves exert pressure on the first diaphragm 101 through an opening 45 in the substrate 40. Under the pressure caused by the sound waves, the first diaphragm 101 can bend towards or away from the first backplate 111. Because the second diaphragm 102 is jointed with the first diaphragm 101 at multiple locations by pillars 120, when the first diaphragm 101 bends towards or away from the first backplate 111, the second diaphragm 102 bends towards or away from the second backplate 112 in synchronization. Because such synchronization, the total change of the capacitance value due to the sound waves can be enhanced, for example, by connecting in parallel a first capacitor element (formed between the first diaphragm 101 and the first backplate 111) with a second capacitor element (formed between the second diaphragm 102 and the second backplate 112).

For example, in FIG. 2, electrical contacts 82 and 84 can be respectively connected to the first diaphragm 101 and backplate 111 to form the two terminals of the first capacitive element; electrical contacts 86 and 88 can be respectively connected to the second diaphragm 102 and the second backplate 112 to form the two terminals of the second capacitive element. The first capacitive element and the second capacitive element can be connected in parallel by connecting the electrical contact 82 with the electrical contact 86 to form a first combined terminal and by connecting the electrical contact 84 with the electrical contact 88 to form a second combined terminal. The capacitance change between the first combined terminal and the second combined terminal will be the sum of the capacitance change of the first capacitive element and the capacitance change of the second capacitive element.

In FIG. 2, there are multiple air holes 155 located at places outside the boundaries defining the first empty space 161, the second empty space 162, and the third empty space 163. The multiple air holes 155 are implemented to balance a first pressure at one side of the microphone 100 (e.g., the side near the opening 45) with a second pressure at the other side of the microphone 100 (e.g., the side near the second backplate 112). Such balancing of the two pressures can decrease the chance of breaking the diaphragms 101 and 102 when a large air pressure is present at a location near the opening 45 of the microphone 100. Each of the air holes 155 passes the first diaphragm 101, the first backplate 111, the second diaphragm 102, and the second backplate 112, respectively through an open hole 155A, an open hole 155B, an open hole 155C, and an open hole 155D. In some embodiments, open holes 155A, open holes 155B, open holes 155C, and open holes 155D—which are shown in FIG. 3A, FIG. 3B, FIG. 3C, and FIG. 3D respectively—are distributed evenly near the circumference of a circle.

Figure 3E:
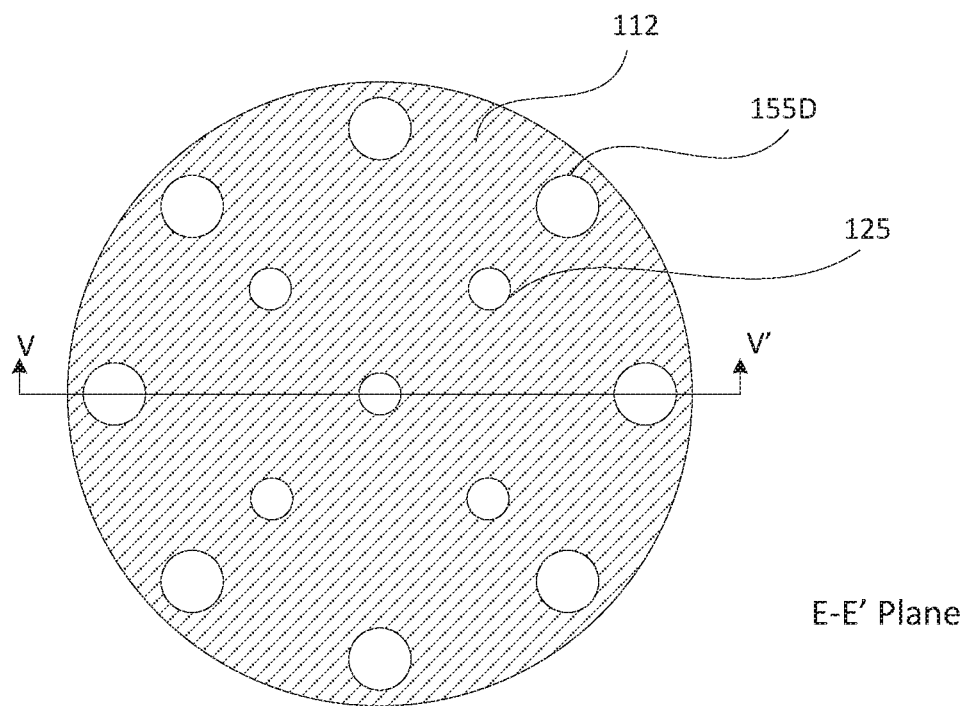
FIG. 3E is a schematic of the second backplate having an alternative layout of the vent holes as viewed in a plane in accordance with some embodiments.

In FIG. 3A, in addition to the open holes 155A, locations 120A that indicate where the end of one of the pillars 120 joints the first diaphragm 101 are also shown, in accordance with some embodiments. In FIG. 3B, in addition to the open holes 155B, accommodating-openings 115 that allow the pillars 120 to pass through the first backplate 111 are also shown, in accordance with some embodiments. In FIG. 3C, in addition to the open holes 155C, locations 120C that indicate where the end of one of the pillars 120 joints the second diaphragm 102 are also shown, in accordance with some embodiments. The locations of the multiple openings 105 in the second diaphragm 102 have not been shown in FIG. 3C. In FIG. 3D, in addition to the open holes 155D, the layout of the vent holes 125 in the second backplate 112 are also shown, in accordance with some embodiments. Each of the vent holes 125 forms an air connection—through the second backplate 112—between the third empty space 163 and the inner space 138 of one of the chambers 130. In FIG. 3E, an alternative layout of the vent holes 125 in the second backplate 112 are illustrated, in accordance with some embodiments.

In the embodiments as shown in FIGS. 3A-3D, the open holes (e.g., 155A, 155B, 155C, and 155D), the accommodating-openings 115 for passing the pillars, and the ends of the pillars (e.g., 120A and 120D) are all in the shape of a circle; in other embodiments, they can be in other geometric shapes. When a pillar 120 is in the form of a cylinder, the diameter of the circle surrounding the accommodating-opening 115 is larger than the diameter of the circle surrounding the cross-section of this pillar 120.

FIG. 4, FIGS. 5A-5D, and FIGS. 6A-6D are cross-section views of device structures for showing methods of manufacturing a MEMS microphone 100 that has dual diaphragms in accordance with some embodiments.

Figure 4:
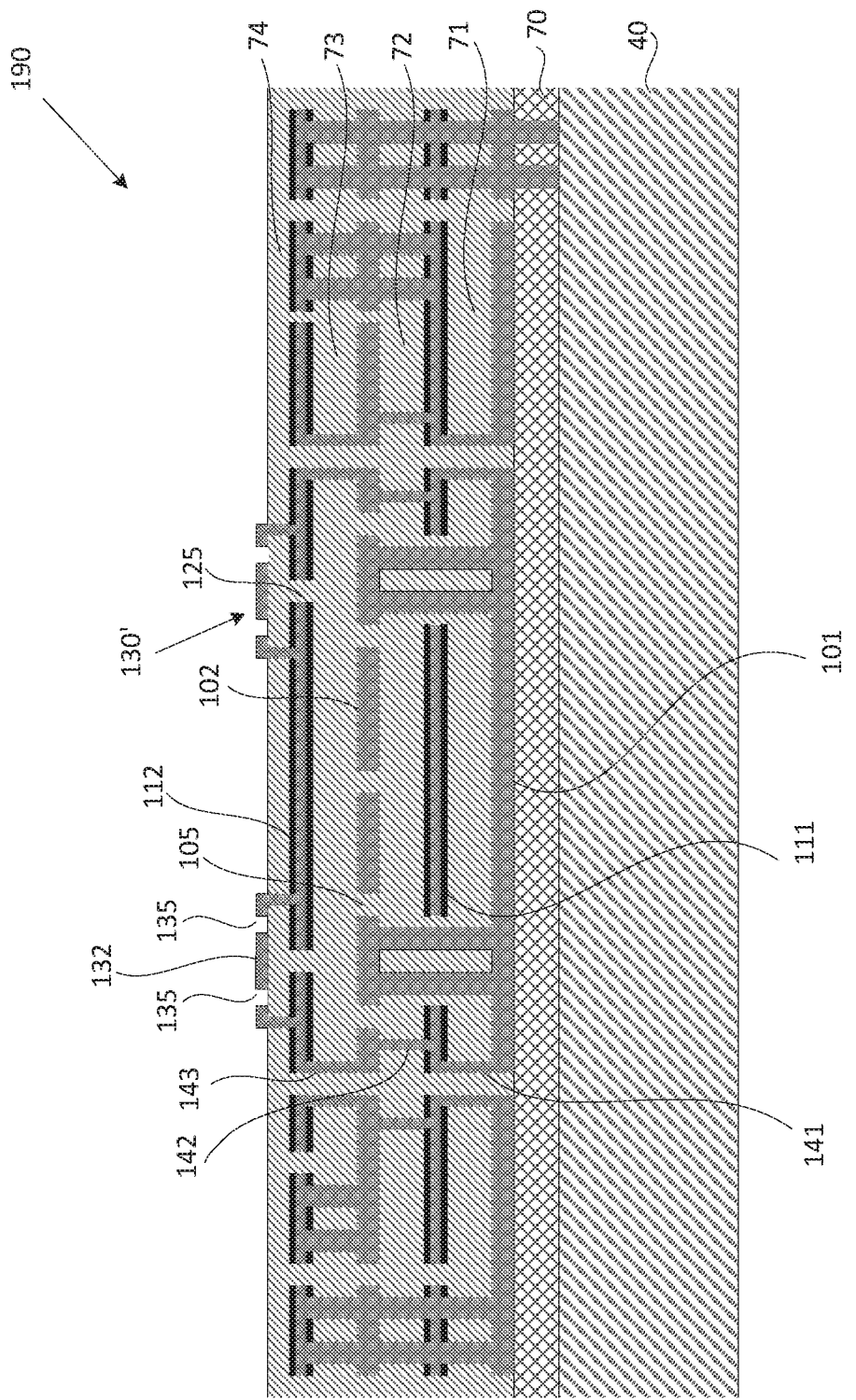
FIG. 4 is a cross-section view of a device structure that is an intermediate product created during the process of manufacturing in accordance with some embodiments.

FIG. 4 is a cross-section view of a device structure 190 that is an intermediate product created during the process of manufacturing the MEMS microphone 100 in accordance with some embodiments. The device structure 190 includes a substrate 40, a first diaphragm 101, a second diaphragm 102, a first backplate 111, and a second backplate 112. The first diaphragm 101 is supported by the substrate 40. In the embodiment as shown in FIG. 4, the first diaphragm 101 is formed in a first conducting layer deposited on a base oxide layer 70 supported by the substrate. In some embodiments, the first diaphragm 101 can be formed in a first conducting layer deposited on the substrate without the base oxide layer 70. The first backplate 111, with multiple accommodating-openings 115, is separated from the first diaphragm 101 by a first layer of oxide material 71.

The second diaphragm 102 is separated from the first backplate 111 by a second layer of oxide material 72. The first backplate 111 is located between the first diaphragm 101 and the second diaphragm 102. The second diaphragm 102 joints the first diaphragm together at multiple locations by pillars 120 through the accommodating-openings 115 in the first backplate 111. The second backplate 112, with vent hole 125, is separated from the second diaphragm 102 by a third layer of oxide material 73. The second diaphragm 102 is located between the first backplate 111 and the second backplate 112. In general, an accommodating-opening 115 is sufficiently larger than the cross-section of a pillar 120 to allow the pillar 120 move freely relative to the first backplate 111 along the direction perpendicular to the plane of the first backplate 111, after the oxides separating the accommodating-opening 115 and the pillar 120 are removed in later processing steps.

In FIG. 4, multiple chamber precursor structures 130' are located at one side of the second backplate 112. Each chamber precursor structure 130' in FIG. 4 is filled with oxide material and has one side aligned with a vent hole 125 on the second backplate 112 and has the other side formed by a side wall 132. The side wall 132, with two sealable openings 135, is separated from the second backplate 112 by a fourth layer of oxide material 74.

During the process of fabricating the device structure 190, the first diaphragm 101, the first backplate 111, the second diaphragm 102, and the second backplate 112 are sequentially fabricated layer by layer, followed by the fabrication of the multiple chamber precursor structures 130'. The first diaphragm 101, which is fabricated before the fabrication of other diaphragm and backplates, is formed in a first conducting layer deposited on a base oxide layer 70 supported by a substrate 40. In the next step, the first backplate 111, with multiple accommodating-openings 115, is formed on a first oxide layer 71 deposited on the first conducting layer that has the first diaphragm 101. In some embodiments, before the first backplate 111 is formed, the first seal structure 141 can be formed, at a first boundary enclosing the first empty space 161, between the first diaphragm 101 and the first backplate 111. In one example, the first seal structure 141 can be formed by depositing needed material in an opening trench, formed in the first oxide layer 71, along the first boundary enclosing an oxide filled volume space for creating the first empty space 161.

In the next step, a second diaphragm 102 is formed in a second conducting layer on a second oxide layer 72 deposited on the first backplate 111, with the second diaphragm 102 jointing the first diaphragm 101 together at multiple locations by pillars 120 through the accommodating-openings 115 in the first backplate 111. In some embodiments, before the second diaphragm 102 is formed, the second seal structure 142 can be formed at a second boundary enclosing an oxide filled volume space for creating the second empty space 162 between the second diaphragm 102 and the first backplate 111. In one example, the second seal structure 142 can be formed by depositing needed material in an opening trench, formed in the second oxide layer 72, along the second boundary enclosing the oxide filled volume space for creating the second empty space 162.

In the next step, a second backplate 112, with the vent holes 125, is formed on a third oxide layer 73 deposited on the second conducting layer that has the second diaphragm 102. In some embodiments, before second backplate 112 is formed, a third seal structure 143 can be formed, at a third boundary enclosing an oxide filled volume space for creating the third empty space 163 between the second diaphragm 102 and the second backplate 112. In one example, the third seal structure 143 can be formed by depositing needed material in an opening trench and formed in the third oxide layer 73, along the third boundary enclosing the oxide filled volume space for creating the third empty space 163.

In the next step, multiple chamber precursor structures 130' are formed. Each one of the multiple chamber precursor structures 130' has one side aligned with a vent hole 125 in the second backplate 112. In the process of forming the multiple chamber precursor structures 130', a side wall 132 for each chamber precursor structure 130' is formed on a fourth oxide layer 74 deposited on the second backplate 112. In one embodiment as shown in FIG. 4, the side wall 132 has two sealable openings 135. In some embodiments, before the side wall 132 is formed for the chamber precursor structure 130', the other walls for the chamber precursor structure 130' (which encloses the chamber precursor structure 130' by connecting the side wall 132 with the second backplate 112) can be formed by depositing needed material in an opening trench formed in the fourth oxide layer 74.

During the process of fabricating the device structure 190, various micro-fabrication techniques are used. In some embodiments, layers of materials for fabricating the device structure 190 can be formed by a deposition process, such as, chemical vapor deposition (CVD), physical vapor deposition (PVD), or atomic layer deposition (ALD). For example, a deposition process can be used for forming a layer of material for fabricating a diaphragm (e.g., 101 and 102), a layer of material for fabricating a backplate (e.g., 111 or 112), a layer of material for fabricating various walls (e.g., 132) of the chamber precursor structure, or a layer of oxides (e.g., 70, 71, 72, 73, or 74). In some embodiments, an oxide layer can be formed by a thermal process. For example, in FIG. 4, the layer of base oxide 70 can be formed by placing a silicon substrate 40 in gases that is rich in oxygen (e.g., oxygen gas mixed with argon gas) in an elevated temperature; other layer of oxides (e.g., 71, 72, 73, or 74) can be formed by thermally oxidizing a layer of previously deposited polysilicon.

In FIG. 4, each of the first diaphragm 101, the first backplate 111, the second diaphragm 102, and the second backplate 112 can be formed in an etching process according to designed patterns in a mask layer. In some embodiments, the mask layer can be photoresist or a nitride (e.g., $Si_3N_4$) patterned using a photolithography process. In some embodiments, the etching process can be a dry etching process, for example, using a dry etchant that has an etching chemistry comprising a fluorine species (e.g., $CF_4$, $CHF_3$, $C_4F_8$). During the process of fabricating the device structure 190, various patterned oxide layers need to be formed in the oxide layer 70, 71, 72, 73, or 74; these patterned oxide layers can be also formed in an etching process using a wet etchant.

In some embodiments for fabricating the device structure 190, each of the first diaphragm 101 and the second diaphragm 102 can be formed in a layer of polysilicon. In some embodiments, when the first diaphragm 101 is formed, the open holes 155A and the structures for electrical contacts (e.g., 81 and 82) are formed in the same layer of polysilicon. In some embodiments, when the second diaphragm 102 having openings 105 is formed, the open holes 155C and the structures for electrical contacts (e.g., 81, 82, 84, and 86) are formed in the same layer of polysilicon.

In some embodiments, each of the first backplate 111 and the second backplate 112 can be formed in a layer of polysilicon. In some embodiments, each of the first backplate 111 and the second backplate 112 can be formed in a layer of polysilicon sandwiched between two layers of silicon nitride. In some embodiments, when the first backplate 111 having accommodating-openings 115 is formed, the open holes 155B and the structures for electrical contacts (e.g., 81, 82, and 84) are formed in the same layer. In some embodiments, when the second backplate 112 having vent holes 125 is formed, the open holes 155D and the structures for electrical contacts (e.g., 81, 82, 84, 86, and 88) are formed in the same layer.

In some embodiments, each layer of oxides (e.g., 70, 71, 72, 73, or 74) can be a layer of silicon oxide. In some embodiments, when the layer of base oxide 70 is patterned, via holes for electrical contacts (e.g., 81) are formed in the same layer. In some embodiments, when the first oxide layer 71 is patterned, the needed openings for fabricating pillars 120, the needed opening trenches for fabricating the first seal structure 141, and the via holes for electrical contacts (e.g., 81 and 82) are formed in the same layer. In some embodiments, when the second oxide layer 72 is patterned, the needed openings for fabricating pillars 120, the needed opening trenches for fabricating the second seal structure 142, and the via holes for electrical contacts (e.g., 81, 82, and 84) are formed in the same layer. In some embodiments, when the third oxide layer 73 is patterned, the needed opening trenches for fabricating the third seal structure 143 and the via holes for electrical contacts (e.g., 81, 82, 84, and 86) are formed in the same layer of silicon oxide.

In some embodiments, when the fourth oxide layer 74 is patterned, the needed opening trenches for fabricating the walls to enclose the chamber precursor structures 130' are formed in the fourth oxide layer 74; then, the walls to enclose the chambers 130 is fabricated in these opening trenches in the fourth oxide layer 74, and the side walls 132 having sealable openings 135 are fabricated in a layer of material on the fourth oxide layer 74. In some embodiments, the walls to enclose the chamber precursor structures 130' by depositing poly-silicon into the opening trenches in the fourth oxide layer 74; the side walls 132 can be formed by depositing poly-silicon on the fourth oxide layer 74, and followed by a patterning process.

FIGS. 5A-5D are cross-section views of device structures for showing one method of manufacturing a MEMS microphone 100 that has dual diaphragms in accordance with some embodiments. With this manufacturing method, the sealable openings 135 in the side wall 132 for a chamber 130 as shown in FIG. 4 are hermetically sealed with an oxide layer.

Figure 5A:
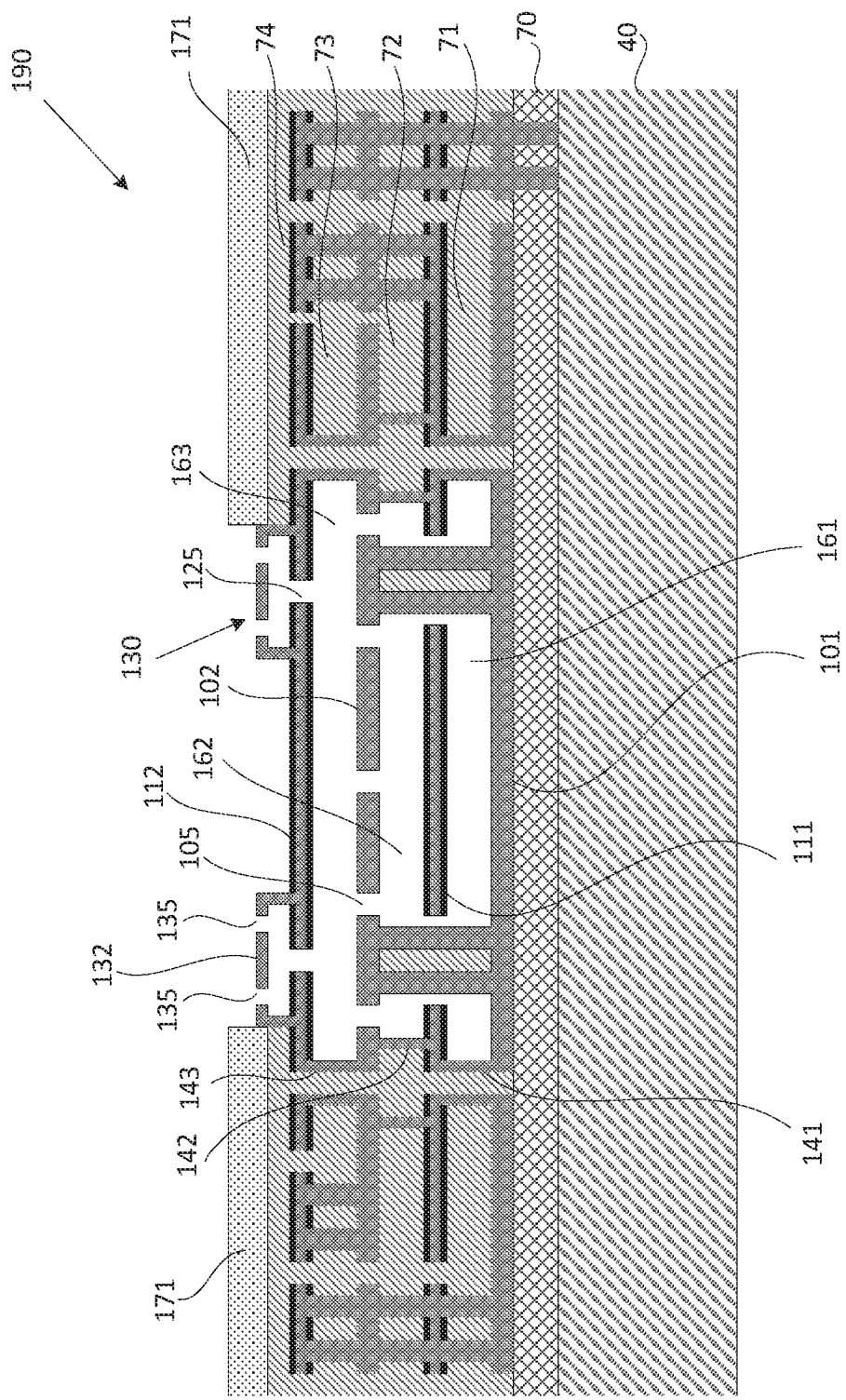

As shown in FIG. 5A, after the device structure 190 as shown in FIG. 4 is fabricated, a first protection mask 171 is formed to expose sealable openings 135 for an etching process while protecting other parts of the fourth oxide layer 74. In one embodiment, the first protection mask 171 is formed by creating predetermined patterns in a photoresist layer. Next, the device structure 190 is immersed in a wet etchant to remove oxide materials in parts of some oxide layers (e.g. 74, 73, 72, and 71) to form the inner space 138 (see FIG. 5B) and the empty spaces (e.g., 163, 162, 161). The wet etch also removes oxide materials from the chamber precursor structures 130' to provide chambers 130. Examples of the wet etchant that can be used for removing these oxide materials include hydrofluoric acid (HF), Buffered Oxide Etch (BOE) solution (6 parts 40% NH4F and 1 part 49% HF), or Tetramethylammonium hydroxide (TMAH).

Figure 5B:
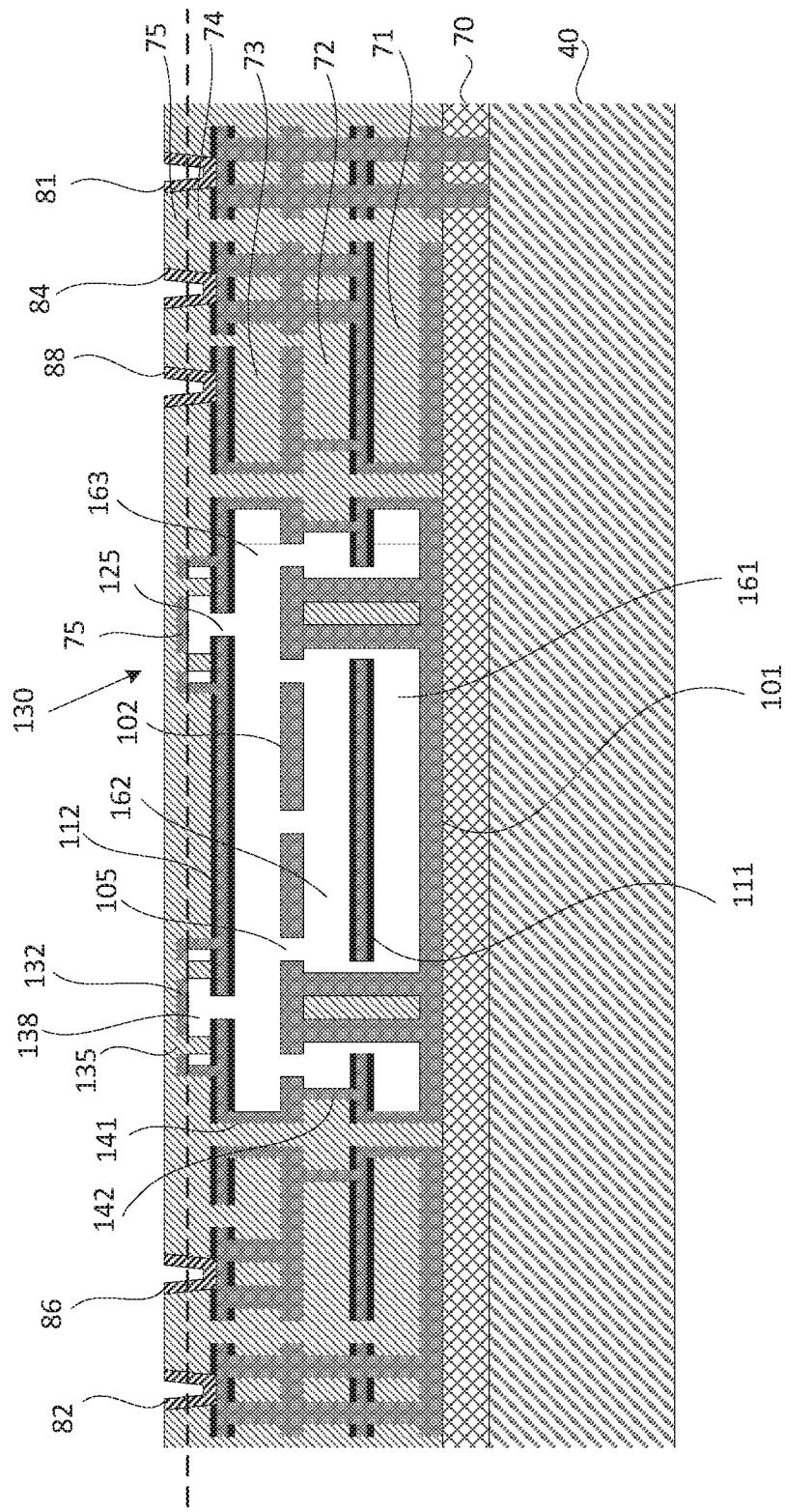

In the next step, as shown in FIG. 5B, after the first protection mask 171 is removed (e.g., by stripping off the photoresist), a fifth oxide layer 75 is deposited on the fourth oxide layer 74 and on the side walls 132 to hermetically seal off the sealable openings 135 in the side wall 132. Then, the via holes 182, 184, 186, 188, and 181 respectively for electrical contacts 82, 84, 86, 88, and 81 are made in the fifth oxide layer 75 and the fourth oxide layer 74, before these electrical contacts are made by depositing and patterning one or more metal layers on the fifth oxide layer 75. In some embodiments, during the process for hermetically sealing off the sealable openings 135, the fifth oxide layer 75 can be deposited on the fourth oxide layer 74 and on the side walls 132 while the device structure 190 is maintained in a vacuum space (e.g., with a pressure ranging from $10^{-9}$ to $10^{-3}$ torr).

Figure 5C:
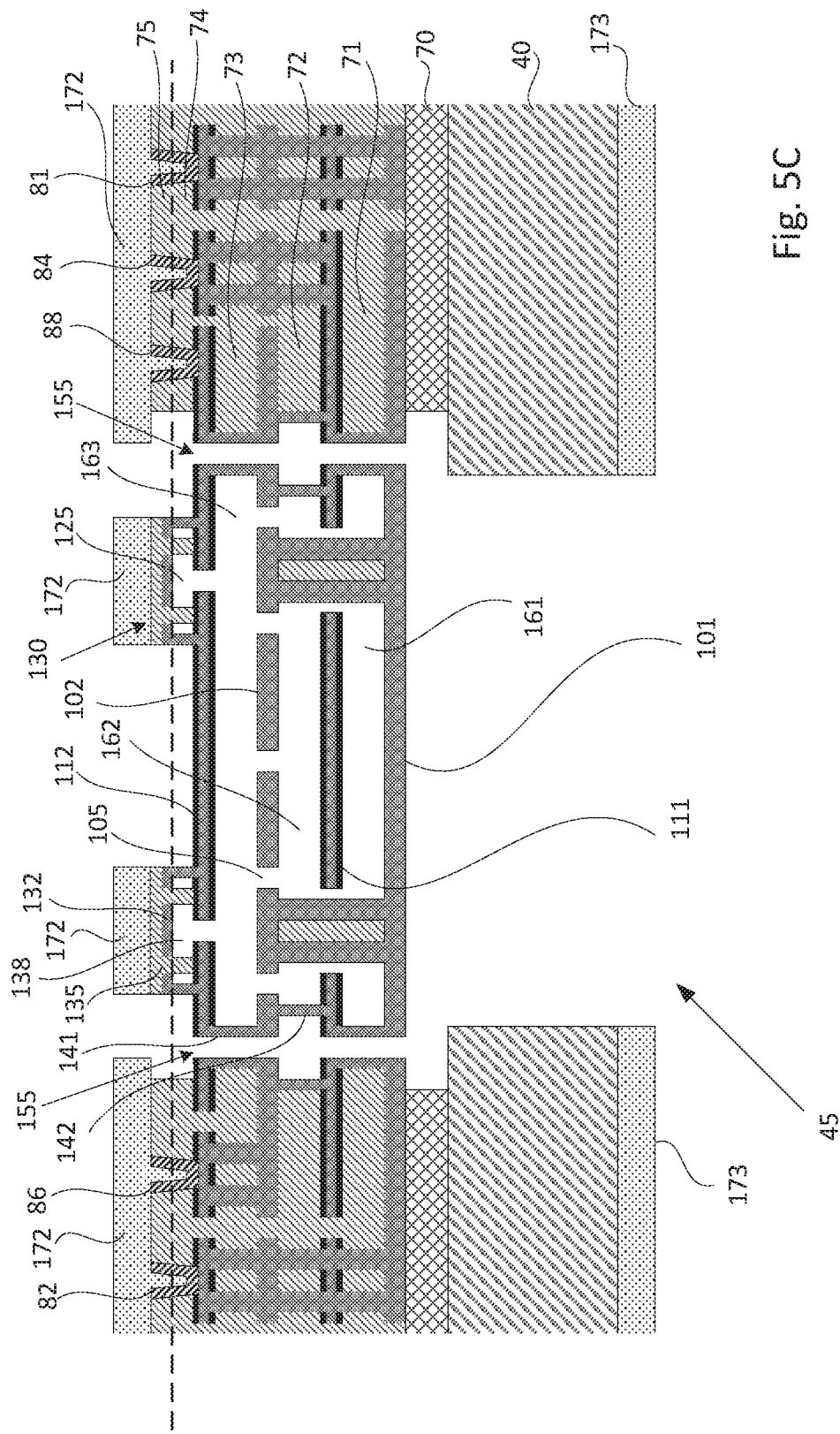

In the next step, as shown in FIG. 5C, a second protection mask 172 (e.g., in a photoresist layer) is formed on the fifth oxide layer 75 to open up parts of the fifth oxide layer 75 for forming the air holes 155 in an etching process. In this etching process, the device structure 190 is immersed in a wet etchant to remove some oxide materials in selected parts of the oxide layers 75, 74, 73, 72, 71, and 70. These removed oxide materials, as shown in FIG. 6C, include materials in the fifth oxide layer 75 covering the open hole 155D, in the fourth oxide layer 74 covering the open hole 155D, in the third oxide layer 73 between the open hole 155D and the open hole 155C, in the second oxide layer 72 between the open hole 155C and the open hole 155B, in the first oxide layer 71 between the open hole 155B and the open hole 155A, and in the base oxide layer 70 covering the open hole 155A.

In FIG. 5C, a third protection mask 173 (e.g. in a photoresist layer) is formed on the substrate 40 to open up selected parts of the substrate 40 for an etching process. Then, the substrate 40 is etched according to this third protection mask 173 to create an opening 45 in the substrate 40. In some embodiments, the opening 45 in the substrate 40 can be created by anisotropic plasma etching. In some embodiments, before the third protection mask 173 is formed on the substrate 40, the substrate 40 can be grinded to a predetermined thickness. In some embodiments, the predetermined thickness can be in the range from 20 μm to 400 μm.

In the next step, as shown in FIG. 5D, after removing the second protection mask 172 and the third protection mask 173, the MEMS microphone 100 having dual diaphragm is fabricated.

FIGS. 6A-6D are cross-section views of device structures for showing another method of manufacturing a MEMS microphone 100 that has dual diaphragms in accordance with some embodiments. With this manufacturing method, the sealable openings 135 in the side wall 132 for the chamber precursor structure 130' as shown in FIG. 4 are hermetically sealed with a metal layer.

Figure 6A:
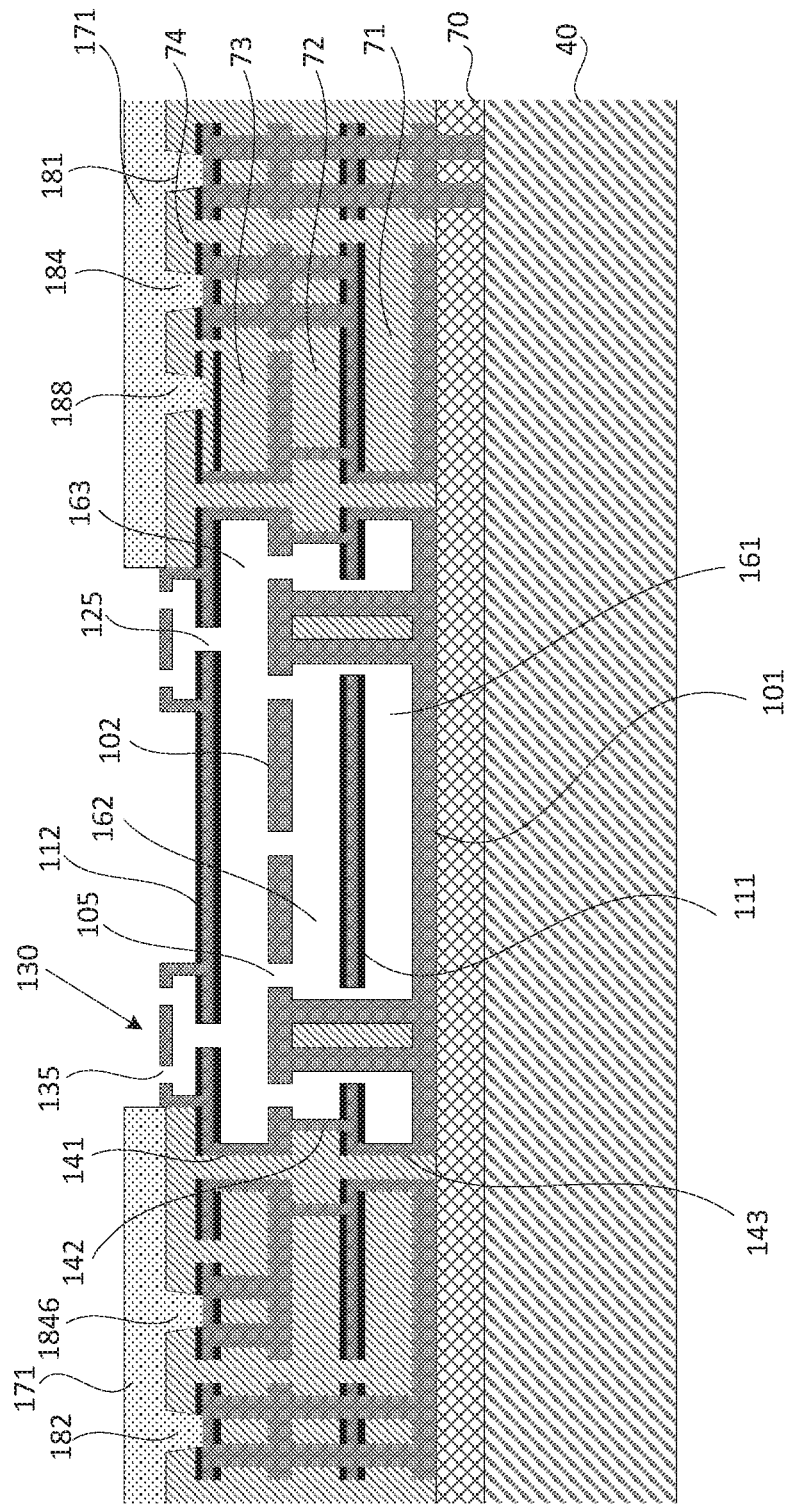
FIGS. 6A-6D are cross-section views of device structures for showing another method of manufacturing a MEMS microphone in accordance with some embodiments.

As shown in FIG. 6A, after the device structure 190 as shown in FIG. 4 is fabricated, a first protection mask 171 (e.g., in a photoresist layer) is formed to expose sealable openings 135 for an etching process while protecting other parts of the fourth oxide layer 74. Next, the device structure 190 is immersed in a wet etchant to remove oxide materials in parts of some oxide layers (e.g. 74, 73, 72, and 71) to form the inner space 138 (see FIG. 6B) and the empty spaces (e.g., 163, 162, 161). The wet etch also removes oxide materials from the chamber precursor structures 130' to provide chambers 130. In one embodiment, before the first protection mask 171 is formed as shown in FIG. 6A, the via holes 182, 184, 186, 188, and 181 respectively for electrical contacts 82, 84, 86, 88, and 81 are made in the fourth oxide layer 74.

Figure 6B:
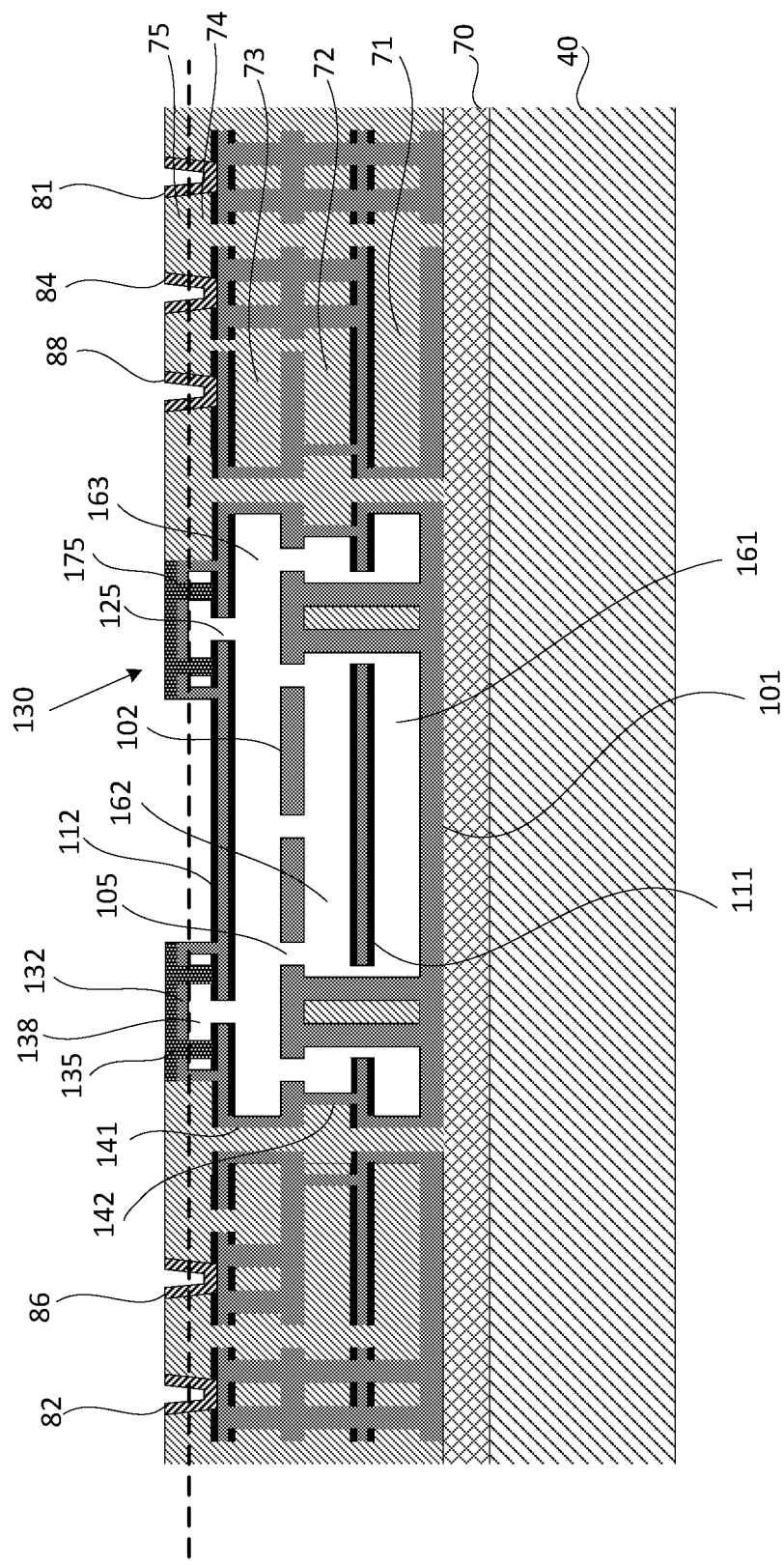
Figure 6C:
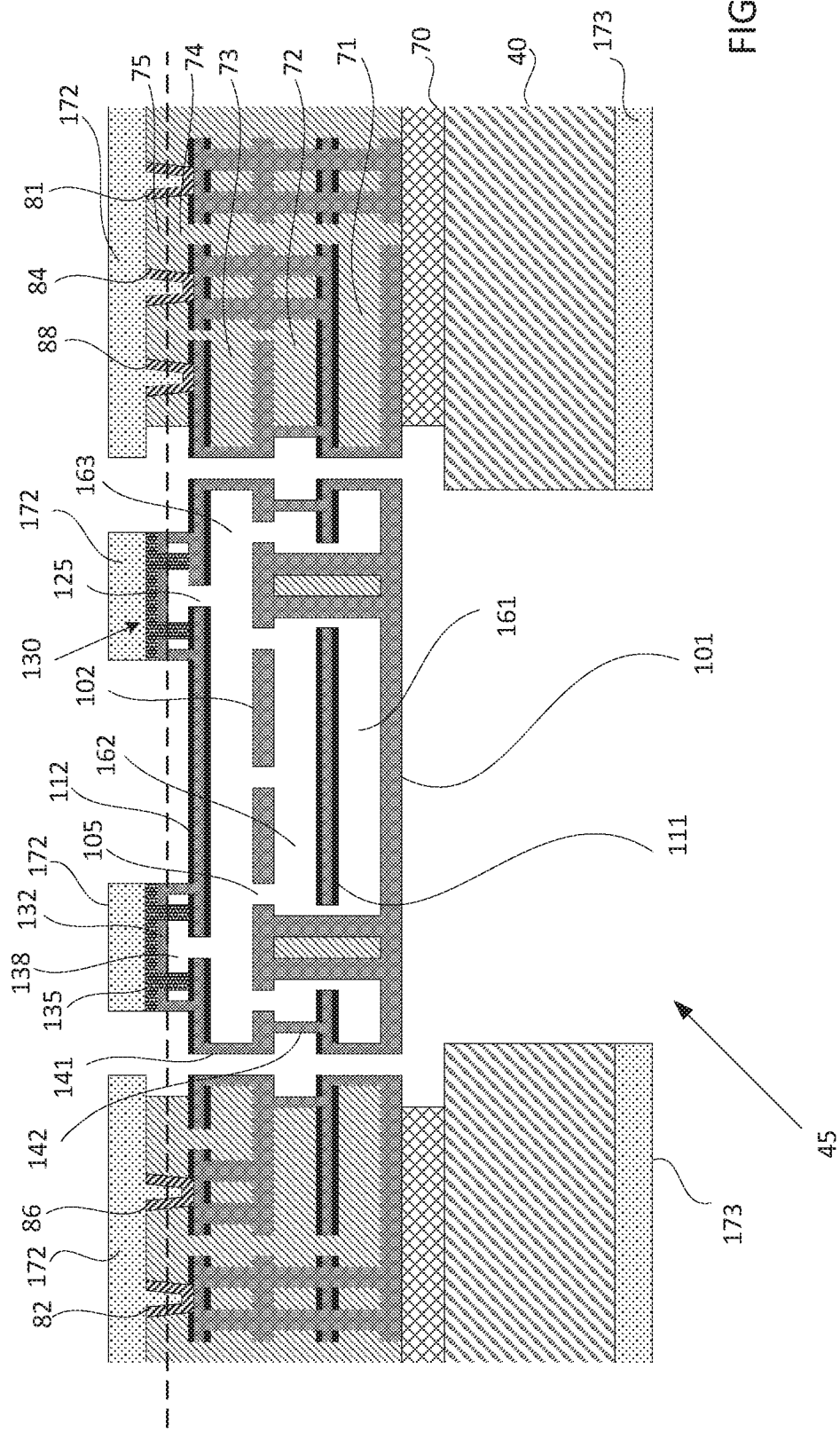

In the next step, as shown in FIG. 6B, after the first protection mask 171 is removed (e.g., by stripping off the photoresist), a metal layer 175 is deposited on the side walls 132 to hermetically seal off the sealable openings 135 in the side wall 132, while the device structure 190 is maintained in a vacuum space (e.g., with a pressure ranging from $10^{-9}$ to $10^{-3}$ torr). In some embodiments, when the metal layer 175 is deposited on the side walls 132, the metal layer 175 is also deposited on the fourth oxide layer 74 in the same step, to form the electrical contacts 82, 84, 86, 88, and 81 respectively through the via holes 182, 184, 186, 188, and 181. In some other embodiments, the electrical contacts 82, 84, 86, 88, and 81 can be made in a separate step, by depositing and patterning a metal layer, on the fourth oxide layer 74, that is different from the metal layer 175.

In the next step, as shown in FIG. 6C, a second protection mask 172 (e.g. in a photoresist layer) is formed on the fourth oxide layer 74 to open up parts of the fourth oxide layer 74 for forming the air holes 155 in an etching process. In this etching process, the device structure 190 is immersed in a wet etchant to remove some oxide materials in selected parts of the oxide layers 74, 73, 72, 71, and 70, as shown in FIG. 6C.

In FIG. 6C, a third protection mask 173 (e.g. in a photoresist layer) is formed on the substrate 40 to open up selected parts of the substrate 40 for an etching process. Then, the substrate 40 is etched according to this third protection mask 173 to create an opening 45 in the substrate 40. In some embodiments, before the third protection mask 173 is formed on the substrate 40, the substrate 40 can be grinded to a predetermined thickness.

Figure 6D:
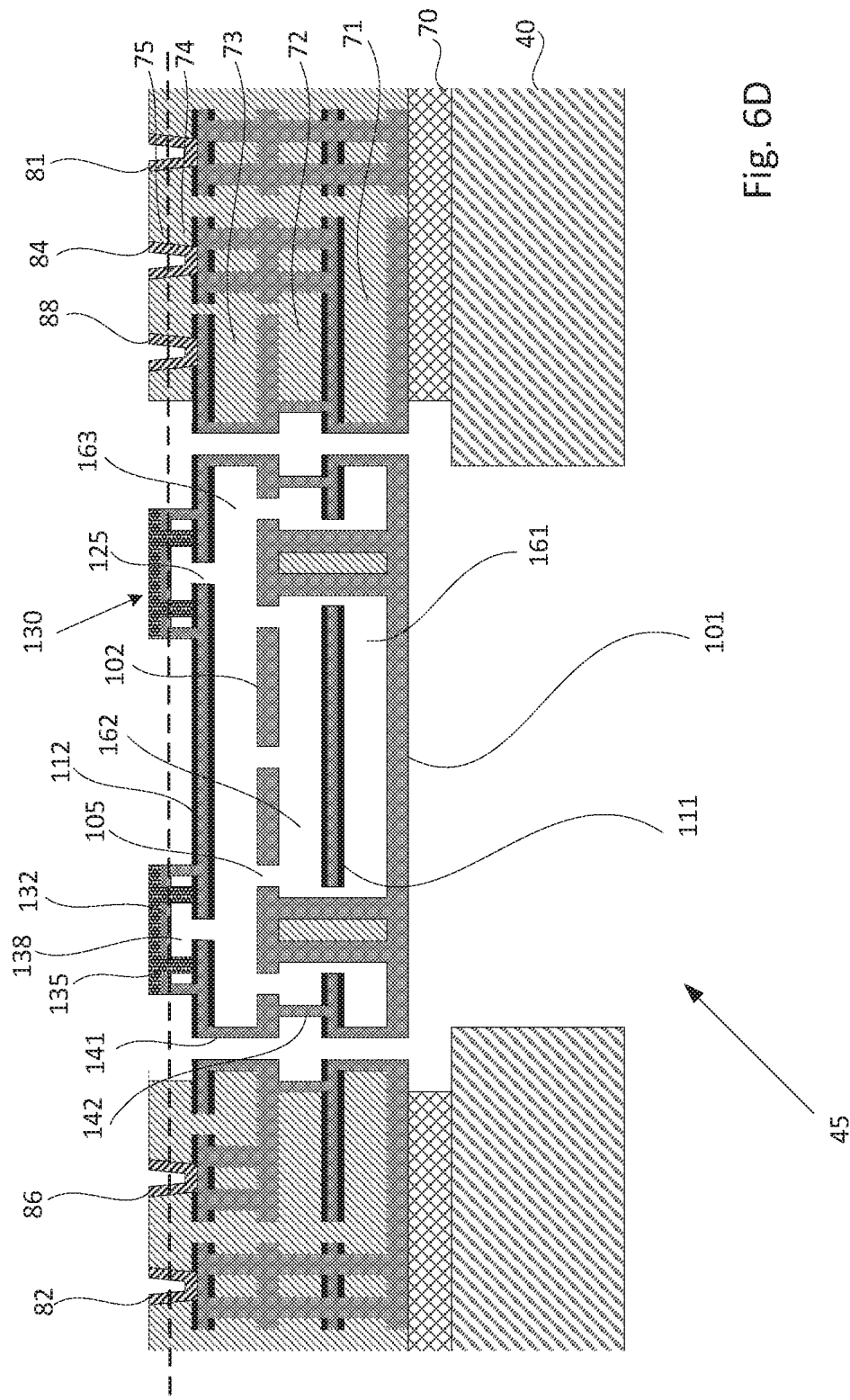

In the next step, as shown in FIG. 6D, after removing the second protection mask 172 and the third protection mask 173, the MEMS microphone 100 having dual diaphragm is fabricated.

Some aspects of the present disclosure relate to a microphone. The microphone includes a substrate having an opening, a first diaphragm, a first backplate, a second diaphragm, and a second backplate. The first diaphragm faces the opening in the substrate. The first backplate includes multiple accommodating-openings and it is spaced apart from the first diaphragm. The second diaphragm joints the first diaphragm together at multiple locations by pillars passing through the accommodating-openings in the first backplate. The first backplate is located between the first diaphragm and the second diaphragm. The second backplate includes at least one vent hole and it is spaced apart from the second diaphragm. The second diaphragm is located between the first backplate and the second backplate.

Other aspects of the present disclosure relate to a method of manufacturing a microphone. An intermediate device structure is fabricated. The intermediate device structure includes a first diaphragm supported by a substrate, a first backplate, a second diaphragm, a second backplate, and multiple chambers. The first backplate includes multiple accommodating-openings and it is separated from the first diaphragm by a first layer of oxide material, and a second backplate. The second diaphragm is separated from the first backplate by a second layer of oxide material and it joints the first diaphragm together at multiple locations by pillars passing through the accommodating-openings in the first backplate. The first backplate is located between the first diaphragm and the second diaphragm. The second backplate includes at least one vent hole and it is separated from the second diaphragm by a third layer of oxide material. The second diaphragm is located between the first backplate and the second backplate. Each of multiple chambers has one side aligned with the at least one vent hole in the second backplate and has the other side formed by a side wall having two sealable openings. The side wall is separated from the second backplate by a fourth layer of oxide material. In the method, after the intermediate device structure is fabricated, a first protection mask is created on the fourth layer of oxide material. The first protection mask exposes the two sealable openings in the side wall for each of the multiple chamber precursor structures. Parts of multiple layers of oxide material are etched to form a first empty space between the first diaphragm and the first backplate, a second empty space between the second diaphragm and the first backplate, and a third empty space between the second diaphragm and the second backplate, and an inner space in each chamber created from each of the multiple chamber precursor structures. The multiple layers of oxide material includes the fourth layer of oxide material, the third layer of oxide material, the second layer of oxide material, and the first layer of oxide material.

Other aspects of the present disclosure relate to a method of manufacturing a microphone. A first diaphragm is formed in a first conducting layer deposited on a base oxide layer supported by a substrate. A first backplate having multiple accommodating-openings therein is formed, and the first backplate is on a first oxide layer deposited on the first conducting layer. A second diaphragm is formed in a second conducting layer on a second oxide layer deposited on the first backplate, with the second diaphragm jointing the first diaphragm together at multiple locations by pillars passing through the accommodating-openings in the first backplate. A second backplate having at least one vent hole therein is formed, and the second backplate is on a third oxide layer deposited on the second conducting layer. A side wall having two sealable openings is formed for each one of multiple chambers, and the side wall is on a fourth oxide layer deposited on the second backplate. Each one of the multiple chambers has another side aligned with a vent hole in the second backplate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microphone comprising:
a substrate having an opening;
a first diaphragm facing the opening in the substrate;
a first backplate including multiple accommodating-openings and spaced apart from the first diaphragm,
a second diaphragm jointing the first diaphragm together at multiple locations by pillars through the accommodating-openings in the first backplate, with the first backplate located between the first diaphragm and the second diaphragm; and
a second backplate including at least one vent hole and spaced apart from the second diaphragm, with the second diaphragm located between the first backplate and the second backplate,
wherein the first diaphragm is disposed in a first conducting layer and disposed on a base oxide layer supported by the substrate.

2. A microphone comprising:
a substrate having an opening;
a first diaphragm facing the opening in the substrate;
a first backplate including multiple accommodating-openings and spaced apart from the first diaphragm,
a second diaphragm jointing the first diaphragm together at multiple locations by pillars through the accommodating-openings in the first backplate, with the first backplate located between the first diaphragm and the second diaphragm;

a second backplate including at least one vent hole and spaced apart from the second diaphragm, with the second diaphragm located between the first backplate and the second backplate;

a first seal structure jointing the first diaphragm and the first backplate at a first boundary enclosing a first empty space between the first diaphragm and the first backplate;

a second seal structure jointing the second diaphragm and the first backplate at a second boundary enclosing a second empty space between the second diaphragm and the first backplate; and a third seal structure jointing the second diaphragm and the second backplate at a third boundary enclosing a third empty space between the second diaphragm and the second backplate.

3. A microphone comprising:

a substrate having an opening;

a first diaphragm facing the opening in the substrate;

a first backplate including multiple accommodating-openings and spaced apart from the first diaphragm, a second diaphragm jointing the first diaphragm together at multiple locations by pillars through the accommodating-openings in the first backplate, with the first backplate located between the first diaphragm and the second diaphragm;

a second backplate including at least one vent hole and spaced apart from the second diaphragm, with the second diaphragm located between the first backplate and the second backplate; and multiple chambers located at one side of the second backplate, wherein at least one of the multiple chambers has an inner space thereof connecting to an empty space at another side of the second backplate through the at least one vent hole in the second backplate, and wherein the at least one of the multiple chambers further comprises:

a side wall spaced apart from the second backplate; and a sealable opening in the side wall.

4. The microphone of claim 3, wherein the at least one of the multiple chambers further comprises:

at least two sealable openings in the side wall.

5. The microphone of claim 4, wherein each of the at least two sealable openings is sealed with a hermetic sealing-layer deposited on the side wall.

6. The microphone of claim 5, wherein the hermetic sealing-layer is a metal layer.

7. The microphone of claim 5, wherein the hermetic sealing-layer is an oxide layer.

8. The microphone of claim 2, wherein the at least one vent hole is circular in shape.

9. The microphone of claim 1, wherein at least one of the first diaphragm and the second diaphragm have a circular outer perimeter.

10. The microphone of claim 2, wherein at least one of the first empty space and the second empty space comprises a vacuum having a pressure ranging from $10^{-9}$ to $10^{-3}$ torr.

11. The microphone of claim 2, wherein the first diaphragm is disposed in a first conducting layer and disposed on a base oxide layer supported by the substrate.

12. The microphone of claim 2, wherein the first diaphragm is disposed in a first conducting layer and disposed directly on the substrate.

13. The microphone of claim 3, wherein the first diaphragm is disposed in a first conducting layer and disposed on a base oxide layer supported by the substrate.

14. The microphone of claim 3, wherein the first diaphragm is disposed in a first conducting layer and disposed directly on the substrate.

15. The microphone of claim 3, wherein the empty space comprises a vacuum having a pressure ranging from $10^{-9}$ to $10^{-3}$ torr.

16. The microphone of claim 3, wherein the at least one vent hole is circular in shape.

17. The microphone of claim 3, wherein the at least one vent hole comprises a plurality of vent holes that are spaced in a symmetric pattern about a central point of the second backplate.

18. The microphone of claim 3, wherein at least one of the first diaphragm and the second diaphragm have a circular outer perimeter.

19. The microphone of claim 3, wherein both the first diaphragm and the second diaphragm have a circular outer perimeter.

20. The microphone of claim 2, wherein the third empty space comprises a vacuum having a pressure ranging from $10^{-9}$ to $10^{-3}$ torr.

* * * * *